(12) United States Patent
Baer

(10) Patent No.: US 6,914,230 B2
(45) Date of Patent: Jul. 5, 2005

(54) SYSTEM AND METHOD FOR REDUCING TRAPPED CHARGE EFFECTS IN A CMOS PHOTODETECTOR

(75) Inventor: Richard L. Baer, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 316 days.

(21) Appl. No.: 10/374,279

(22) Filed: Feb. 26, 2003

(65) Prior Publication Data

US 2004/0164225 A1 Aug. 26, 2004

(51) Int. Cl.[7] .............................................. H01L 31/00
(52) U.S. Cl. .............................. 250/214.1; 250/214 R
(58) Field of Search ........................ 250/214.1, 214 R, 250/208.1; 257/322, 351, 355, 357; 348/313, 314

(56) References Cited

U.S. PATENT DOCUMENTS 3,727,076 A * 4/1973 Mar ............................ 326/130

* cited by examiner

*Primary Examiner*—Que T. Le

(57) ABSTRACT

A system and method for reducing image lag in a complementary metal oxide semiconductor (CMOS) photodetector is disclosed. In one embodiment, the invention is a a method for reducing image lag in an array of complementary metal oxide semiconductor (CMOS) photodetectors by forward biasing the photodetectors during a first time period to charge charge traps in the photodetectors, and reverse biasing the photodetectors during a second time period to remove charge from the photodetectors except the charge trapped in the charge traps.

16 Claims, 4 Drawing Sheets

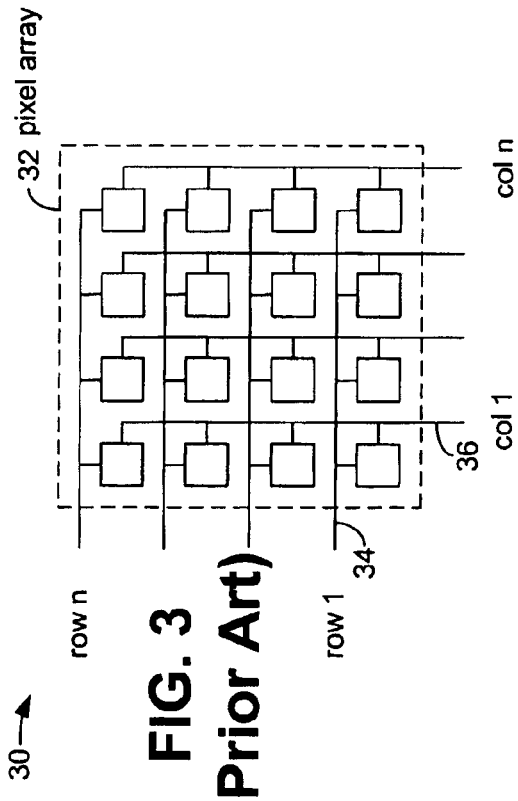
FIG. 4
(Prior Art)
FIG. 3
(Prior Art)
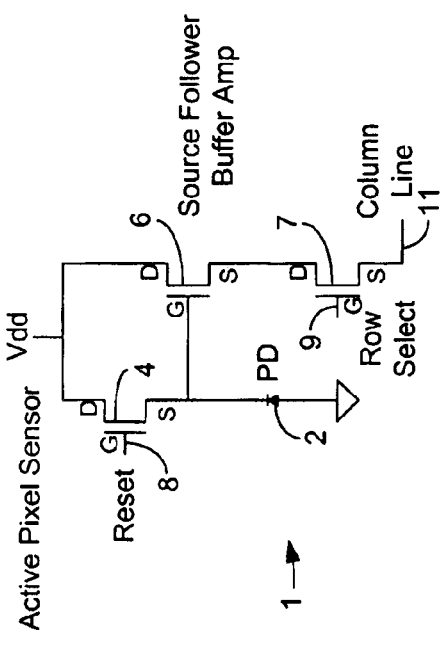
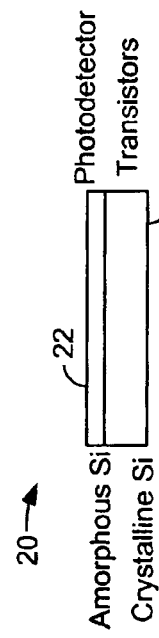
FIG. 1
(Prior Art)
FIG. 2
(Prior Art)

SYSTEM AND METHOD FOR REDUCING TRAPPED CHARGE EFFECTS IN A CMOS PHOTODETECTOR

TECHNICAL FIELD

The invention relates generally to light-capturing devices, and, more particularly, to a system and method for reducing trapped charge effects in a complementary metal oxide semiconductor (CMOS) photodetector.

BACKGROUND OF THE INVENTION

Electronic image sensors are widely used in a variety of electronic cameras and scanners. Historically, most of these sensors have been implemented as charge-coupled devices (CCD). A CCD converts photons captured in individual picture elements (pixels) into electrical charge. In a CCD, complicated clock voltages and high voltage potentials are required to transfer the electric charge that results from the absorption of photons out of the pixel. More recently CMOS active pixel sensors (APS) have been developed. A CMOS active pixel sensor is preferred over a CCD because the circuit that generates the requisite timing signals can be integrated on the same chip with the pixel circuit and because a CMOS active pixel sensor operates at a lower voltage level and consumes less power than a CCD. In a CMOS APS each pixel contains a light-sensitive element, such as a photodetector that can be implemented as a photodiode (pd), and several transistors integrated on the same substrate, referred to as being integrated on the same "chip." The chip comprises multiple layers of semiconductor material formed over a substrate. The elements of the pixel are formed by growing or depositing layers of semiconductor material over the substrate and selectively etching the layers of semiconductor material to form the elements. The pixels are typically arranged in an array having rows and columns to form an image sensor.

In one common implementation, the pixel contains a photodiode and three transistors. Such an implementation is shown in FIG. 1. FIG. 1 is a schematic view of a conventional CMOS pixel 1. The pixel 1 comprises a photodiode 2 and transistors 4, 6 and 7. Each of the transistors 4, 6 and 7 can be a CMOS field effect transistor (CMOSFET). The transistor 4 functions as a reset switch, the transistor 6 functions as a source follower buffer amplifier, referred to as a "source follower," and the transistor 7 functions as a row select switch. The reset transistor 4 is used to initialize the photodiode 2 in a reverse-biased state by coupling the photodiode 2 to voltage source Vdd when the reset transistor 4 is on via a signal on the gate terminal 8. The source follower transistor 6 buffers the output signal of the photodiode 2, and the row select transistor 7 is responsive to a row select signal and connects the output of the pixel on line 11 to a column line that is connected to a column processing circuit (not shown).

One disadvantage of a CMOS APS is that the light sensitive area of the pixel (the light capturing area of the photodiode) is only a small fraction of the total area of the pixel. This disadvantage can be overcome by locating the photodiode in a layer other than the layer in which the transistors are formed, thus maximizing the light capturing area of the photodiode. One way to create such a pixel is to form the transistors in one or more layers of crystalline silicon and then form a layer of α-Si:H (hydrogenated amorphous silicon) over the layer of crystalline silicon in which the transistors are formed. The photodiode is then formed in the layer of α-Si:H. Photodiodes that are formed in this layer of α-Si:H are almost as large as the overall pixel dimensions, and therefore have a larger light sensitive area. A simplified layer structure that includes the transistors and photodiode of FIG. 1 is shown in FIG. 2. The layer structure 20 includes a layer 21 of crystalline silicon in which the transistors 4, 6 and 7 are formed and a layer of hydrogenated amorphous silicon 22 in which the photodiode 2 is formed.

FIG. 3 is a schematic diagram illustrating a simplified image sensor 30 formed using a plurality of the pixels of FIG. 1. The image sensor 30 includes a pixel array 32 that comprises a plurality of pixels 1 arranged in a row and column format. All of the pixels in a row are coupled to a row select line, an exemplary one of which is illustrated using reference numeral 34. All of the pixels in a column are coupled to a common column line, an exemplary one of which is illustrated using reference numeral 36. A reset line is coupled to each pixel in each row, and is omitted for simplicity. In this manner, a row select signal supplied over a row select line by circuitry that is not shown can be used to activate the pixels in a particular row. In response to the row select signal, each of the pixels in a row reads out accumulated charge via its respective column line.

FIG. 4 is a schematic diagram illustrating the operating cycles of two rows of pixels of FIG. 3. For example, during a reset period 41 the pixels in row n will be reset by turning on the reset transistor 4 (FIG. 1) in each pixel. After the reset period 41, the photodiode 2 collects light and accumulates charge during the accumulate period 42. At the end of the accumulate period 42, the accumulated charge is read out of each pixel 1 (FIG. 1) in row n during read period 44 by turning on the row select transistor 7 (FIG. 1) of the pixel. Activating the row select transistor 7 couples the output of the photodiode 2 to a corresponding column line, such as column line 36 in FIG. 3. Although omitted for simplicity, each column line in FIG. 3 is coupled to circuitry for sampling and holding the value of the charge from each pixel. The reset period 41, accumulate period 42 and the read period 44 comprise one operating cycle, also referred to as a "row period," of the pixels in row n. The row period is the time required to read one row of pixels. A frame period is the time required to read all rows in an array.

Unfortunately, while forming the photodiode in a layer of hydrogenated amorphous silicon increases the capture area of the photodiode, the hydrogenated amorphous silicon layer leads to a condition in which some of the light-induced charge in the photodiode cannot be removed during one operating cycle of the pixel. Dangling bonds present in the hydrogenated amorphous silicon and trap charge in the photodiode. The dangling bonds constitute what are referred to as "charge traps" in the photodiode. Hydrogenation of the amorphous silicon reduces the number of dangling bonds by attaching hydrogen atoms to them, but some dangling bonds remain. When the photodiode is exposed to photons of light, electron-hole pairs are created and the charge of the electron is stored in the photodiode. If the photodiode has many of these so called "charge traps," some portion of the electric charge in the photodiode is trapped in the charge traps and will not be released in a single operating cycle. Because the trapped electric charge cannot be released from the photodiode in a single operating cycle, the electric charge is released over a period of successive operating frames.

When combined over an image sensor having many pixels, the effect of electric charge trapped in the photodiode and released over successive operating frames gives rise to a condition referred to as "image lag." When an image sensor suffers from image lag, information from one frame will persist in many subsequent frames. This phenomenon is most noticeable when the image sensor is implemented in a camera. When the camera pans across a bright object in an otherwise dark scene, image lag manifests as a bright trail in an otherwise dark image.

Therefore, it would be desirable to minimize the effect of electric charge trapped in a CMOS photodetector.

SUMMARY OF THE INVENTION

The invention provides several embodiments of a system and method for reducing the effects of electric charge trapped in a CMOS photodetector. In one embodiment, the invention is a system for reducing illumination-dependent trapped charge effects in a complementary metal oxide semiconductor (CMOS) photodetector. The system comprises a negative-polarity voltage source connected to the photodetector via a first switch operable during a first time period to forward bias the photodetector. Forward biasing the photodetector charges charge traps in the photodetector. The system additionally comprises a positive-polarity voltage source connected to the photodetector via a second switch operable during a second time period to reverse bias the photodetector. Reverse biasing the photodetector removes charge from the photodetector except the charge trapped in the charge traps.

In the manner just described, the invention operates to reduce illumination-dependent trapped charge effects in a photodetector by forward biasing the photodetector before the photodetector is reset and begins to accumulate electric charge. The forward biasing charges all the charge traps in the photodetector, rendering the charge traps substantially incapable of storing the illumination-dependent charge that is later generated by the photodetector in response to incident illumination. The signal component contributed to the output signal of the photodetector by the charge traps is therefore independent of the incident illumination.

Embodiments of the invention also provide a method for reducing image lag in an array of complementary metal oxide semiconductor (CMOS) photodetectors. The method comprises forward biasing the photodetectors during a first time period to charge traps in the photodetectors, and reverse biasing the photodetectors during a second time period to remove charge from the photodetectors except the charge trapped in the charge traps.

The invention operates to reduce image lag in the array of photodetectors by forward biasing the photodetectors before the photodetectors are reset and begin to accumulate electric charge. The forward biasing charges the charge traps in all of the photodetectors and renders the charge traps substantially incapable of storing the illumination-dependent charge that is later generated by the photodetectors in response to incident illumination. The signal component contributed to the output signal of the array by the charge traps is therefore independent of the illumination of the individual photodetectors. The signal component is therefore devoid of image information and the perception of image lag is therefore substantially reduced.

Other features and advantages in addition to or in lieu of the foregoing are provided by certain embodiments of the invention, as is apparent from the description below with reference to the following drawings.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

FIG. 1 is a schematic view of a conventional CMOS pixel.

FIG. 2 is a schematic diagram illustrating a simplified layer structure in which the pixel of FIG. 1 can be fabricated.

FIG. 3 is a schematic diagram illustrating a simplified image sensor 30 formed using a plurality of pixels of FIG. 1.

FIG. 4 is a schematic diagram illustrating the operating cycles of two rows of pixels of FIG. 3.

DETAILED DESCRIPTION

Figure 5:
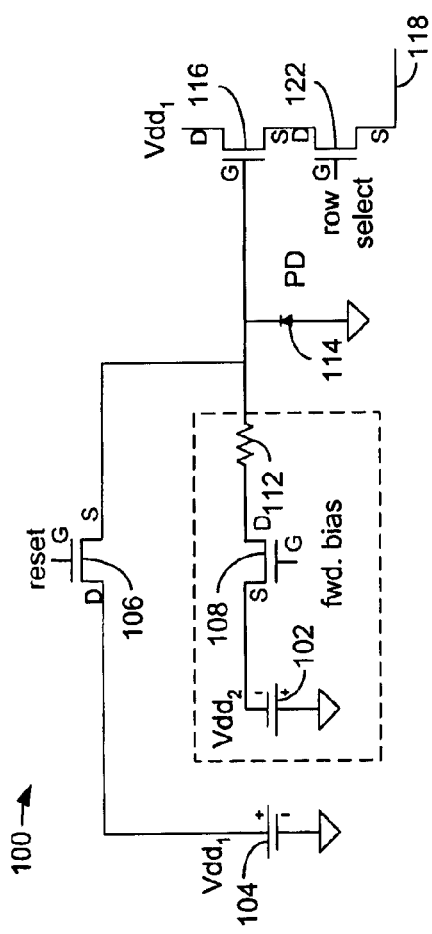
FIG. 5 a schematic diagram illustrating a first embodiment of a pixel constructed in accordance with the invention.

FIG. 5 is a schematic diagram illustrating a first embodiment of a pixel 100 constructed in accordance with the invention. The pixel 100 includes a photodetector 114, a pair of transistor switches 106 and 108, a resistor 112, a transistor 116, a transistor 122, a negative-polarity voltage source 102 and a positive-polarity voltage source 104. Although not shown in FIG. 5, the photodetector 114 is fabricated in a semiconductor layer comprising hydrogenated amorphous silicon, while the transistor switches 106 and 108, the resistor 112 and the transistors 116 and 122 are fabricated in a semiconductor layer comprising crystalline silicon.

The anode of the photodetector 114 is connected to ground. The negative-polarity voltage source 102 is coupled to the cathode of the photodetector 114 via the transistor switch 108 and a resistor 112. Specifically, the source of the transistor switch 108 is connected to the negative-polarity voltage source 102 and the drain is connected to the resistor 112. The transistor switch 108 constitutes a switch with no more than a single pole connected between the negative-polarity voltage source 102 and the photodetector 114.

The positive-polarity voltage source 104 is coupled to the cathode of the photodetector 114 via the transistor switch 106. Specifically, the drain of the transistor switch 106 is connected to the positive-polarity voltage source 104 and the source is connected to the cathode of the photodetector 114.

The cathode of the photodetector 114 is also connected to the gate of transistor 116. The transistor 116 is configured as a source follower buffer amplifier. The drain of the transistor 116 is connected to the positive-polarity voltage source 104 and the source of the transistor 116 is supplied to the drain of the row select transistor 122. The output of the row select transistor 122 is the source on connection 118 and is connected to a column line of the image sensor of which the pixel 100 forms a part, as described above with respect to FIGS. 1 and 3.

It should be mentioned that, while illustrated using CMOS field effect transistors, any type of transistor may be used to implement the transistor switches 106, 108 and the transistors 116 and 122.

In accordance with an aspect of the invention, the circuit described in FIG. 5 operates to reduce illumination-dependent trapped charge effects in a photodetector by forward biasing the photodetector 114 prior to the time that the photodetector is reset and begins to accumulate electric charge. Forward biasing the photodetector 114 charges all of the charge traps in the photodetector and renders the charged charge traps substantially incapable of storing any of the illumination-dependent charge that is generated by the photodetector as a result of exposing the photodetector to light. Rendering the charge traps in the photodetector substantially incapable of trapping illumination-dependent charge reduces illumination-dependent trapped charge effects in the photodetector. The charge trapped in the photodetector 114 contributes a small-trapped charge component to the charge that is read out from the photodetector to the column line after the photodetector has been exposed to light. However, the trapped charge component is independent of the illumination of the photodetector, and can therefore be cancelled, if necessary, by subsequent electrical processing. For example, the trapped charge component can be subtracted from the charge read out from the photodetector by circuitry (not shown) coupled to the respective column line or elsewhere.

In accordance with the invention, an image sensor composed of an array of photodetectors similar to the photodetector 114, a substantially uniform amount of electric charge remains trapped in the charge traps in each of the photodetectors 114 in the array after the photodetectors have been reset as just described. When the image sensor is exposed to light and the charge that accumulates in each photodetector is then read out, the charge read out from each photodetector includes a small charge trap component as just described. Since the charge traps of all the photodetectors in the image sensor are uniformly charged, the charge trap component contributed by each photodetector is substantially uniform over the image sensor and is substantially independent of the illumination of the photodetector. The charge trap components uniformly increase the black level of the image signal generated by the image sensor. If desired, the uniformly increased black level can be subtracted from the image signal by the circuitry (not shown) coupled to each column line in the image sensor or elsewhere.

Even if the charge trap density is not completely uniform over all the photodetectors in the image sensor, an image component generated in response to the charge trap components is static. A static image component is harder for the human eye to detect than an image that moves or otherwise temporally changes.

At the beginning of an operating cycle of the pixel 100, the transistor switch 108 closes to connect the photodetector 114 to the negative polarity voltage source 102 to forward bias the photodetector. Current flow is limited by the resistor 112. Forward biasing photodetector 114 charges all the charge traps within the photodetector 114.

The transistor switch 108 then opens and the transistor switch 106 closes to connect the photodetector 114 to positive-polarity voltage source 104. The transistor switch 106 acts as a reset switch to remove from the photodetector 114 all charge except that which is trapped in the charge traps. In other words, after the photodetector 114 has been reset, only the charge trapped in the charge traps remains in the photodetector. The transistor switch 106 then opens, and the photodetector 114 accumulates charge in response to light incident on the photodetector.

Figure 6:
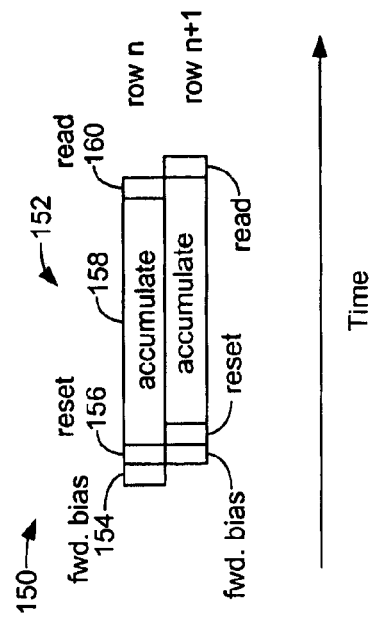
FIG. 6 is a schematic diagram illustrating the operating cycle of two rows of pixels of FIG. 5.

FIG. 6 is a schematic diagram illustrating the operating cycles of two rows of pixels of FIG. 5. Referring additionally to FIG. 5, the row period 152 includes a forward-bias period 154, during which the photodetector 114 is forward biased and the charge traps within the photodetector 114 are charged. The forward-bias period 154 immediately precedes the reset period 156. At the start of row period 152, the forward-bias period 154 begins with the transistor switch 108 closing to forward bias the photodetector 114, which charges all the charge traps in the photodetector 1114.

At the end of the forward-bias period 154, the transistor switch 108 opens and the transistor switch 106 closes to begin the reset period 156 in which the photodetector 114 is reverse biased. During the reset period 156, all the electric charges except that which is trapped in the charge traps is removed from the photodetector 114. At the end of the reset period 156, the transistor switch 106 opens and the accumulate period 158 begins. During the accumulate period 158, the photodetector 114 generates charge in response to the light to which it is exposed. At the end of the accumulate period 158, the row select transistor 122 closes to begin the read period 160. During the read period 160, charge accumulated by the photodetector 114, buffered by the transistor 116, is read out via the connection 118 onto the column line (not shown) of the pixel 100. Row select transistor 122 opens at the end of the read period.

Figure 7:
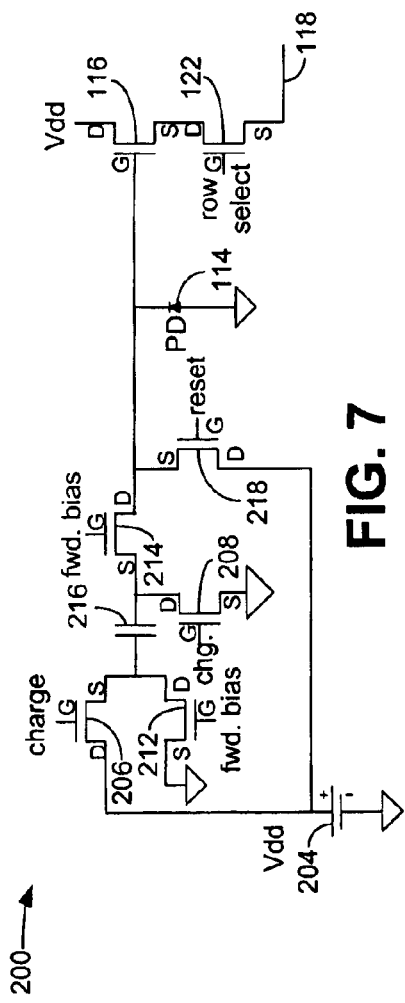
FIG. 7 is a schematic diagram illustrating a second embodiment of a pixel constructed in accordance with the invention.

FIG. 7 is a schematic diagram illustrating a second embodiment 200 of a pixel constructed in accordance with the invention. A possible drawback of the pixel 100 of FIG. 5 when implemented using CMOS technology is that it uses two voltage sources having opposite polarities to forward bias and to reset the photodetector 114. In FIG. 7, a single voltage source 204 charges a capacitor 216 with charge that is later used to forward bias the photodetector 114 and charge the charge traps in the photodetector 114. The single voltage source 204 is also used to reset the photodetector 114. The pixel 200 includes transistor switches 206, 208, 212, 214 and 218.

The cathode of the photodetector 114 is connected to the drain of transistor switch 214, to the source of transistor switch 218 and to the gate of transistor 116. The anode of the photodetector 114 is connected to ground. The drain of transistor switch 218 is connected to the voltage source 204. The drain of transistor switch 206 is connected to the voltage source 204 and the source is connected to the drain of the transistor switch 212 and to one side of capacitor 216. The source of the transistor switch 214 and the drain of the transistor switch 208 are connected to the other side of capacitor 216. The sources of transistor switches 208 and 212 are connected to ground.

When the transistor switches 206 and 208 are closed, the capacitor 216 is charged to the voltage Vdd of the voltage source 204. When the capacitor 216 is fully charged, the transistor switches 206 and 208 open and the transistor switches 212 and 214 close. When the transistor switches 212 and 214 close, the charge stored in the capacitor 216 forward biases the photodetector 114, which charges the charge traps in the photodetector 114. The transistor switches 206, 208, 212 and 214 collectively constitute a double-pole change-over switch arranged to connect the capacitor 216 to the voltage source 204 when the switches 206 and 208 close and the switches 212 and 214 open, and to connect the capacitor to the photodetector with a reversed polarity when the switches 206 and 208 open and the switches 212 and 214 close.

Forward biasing the photodetector 114 by discharging the capacitor 216 charges all the charge traps in the photodetector 114. The transistor switches 212 and 214 then open and the transistor switch 218 closes. Closing the transistor switch 218 connects the photodetector 114 to the voltage source 204. This reverse biases the photodetector 114 and thus performs the reset function. Resetting the photodetector 114 removes all the electric charge from the photodetector 114 except that which is trapped in the charge traps, as described above. When the transistor switch 218 opens, the photodetector 114 begins accumulating charge, which is buffered by the transistor 116. The charge accumulated in the photodetector is read out through row select transistor 122 and connection 118 to a column line as described above.

Figure 8:
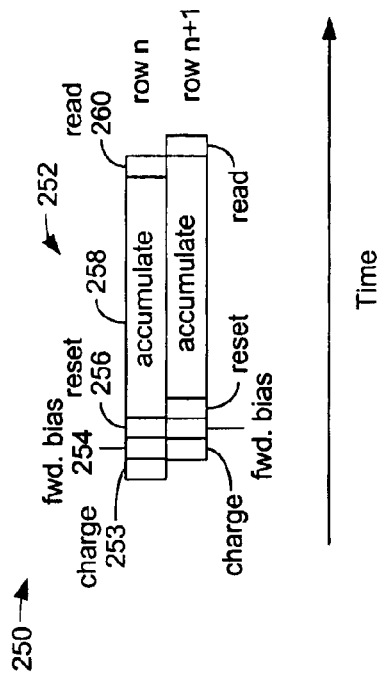
FIG. 8 is a schematic diagram illustrating the operating cycle of two rows of the pixels of FIG. 7.

FIG. 8 is a schematic diagram illustrating the operating cycles of two rows of the pixels of FIG. 7. At the beginning of a charge period 253, the transistor switches 206 and 208 close to charge the capacitor 216 to the voltage of the voltage source 204. At the end of the charge period 253, the transistor switches 206 and 208 open. At the beginning of the forward-bias period 254, the transistor switches 212 and 214 close to forward bias the photodetector 114. During the forward-bias period 254, the charge stored in the capacitor 216 injects current into the photodetector 114 to charge the charge traps in the photodetector 114. At the end of the forward-bias period 254, the transistor switches 212 and 214 open. At the beginning of the reset period 256, the transistor switch 218 closes to connect the photodetector 114 to the voltage source 204. This resets the photodetector and removes all the electric charge from the photodetector 114 except the electric charge trapped in the charge traps in the photodetector 114. At the end of the reset period 256, the transistor switch 218 opens. This also marks the beginning of the accumulate period 258. During the accumulate period 258, the photodetector 114 generates charge in response to the light to which it is exposed. At the end of the accumulate period 258, the row select transistor 122 closes to begin the read period 260. During the read period 260, charge accumulated by the photodetector 114 and buffered by the transistor 116 is read out via the connection 118 onto the column line (not shown) of the pixel 200.

Figure 9:
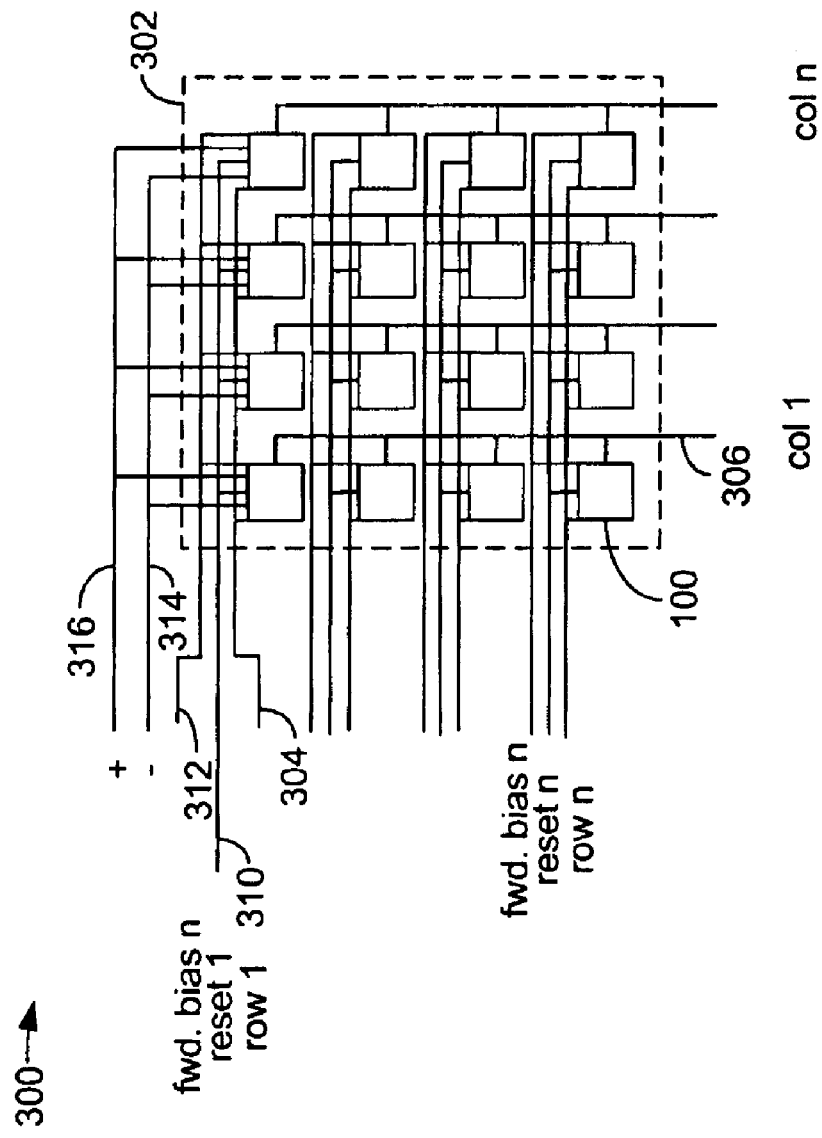
FIG. 9 is a schematic diagram illustrating an image sensor constructed using a plurality of pixels of FIG. 5.

FIG. 9 is a schematic diagram illustrating an image sensor 300 constructed using a two-dimensional array of the pixels 100 of FIG. 5. The image sensor 300 includes a two-dimensional pixel array 302 that comprises a plurality of pixels 100 arranged in a row and column format. All the pixels in a row are coupled to a respective row select line, reset line and forward bias line, exemplary ones of which are indicated using reference numerals 304, 310 and 312, respectively. All the pixels in the array are connected to a trace or set of traces 314 that supplies a negative voltage to each of the pixels. All the pixels in the array are connected to a trace or set of traces 316 that supplies a positive voltage to each of the pixels. A row-wise arrangement of traces is shown as an example. However, this is not critical to the invention. The traces may have a column-wise arrangement, an array-wise arrangement, a row-wise arrangement and a column-wise arrangement or another arrangement.

All the pixels in a column are coupled to a respective column line, an exemplary one of which is indicated using reference numeral 306. A row select signal supplied over a row select line by circuitry that is not shown causes each of the pixels in the row to read out any charge accumulated therein to its respective column line.

In accordance with the invention, a forward bias signal is applied to a pixel 100 via forward bias line 312 prior to the reset signal being applied via reset line 310. As described above, assertion of the forward bias signal defines a forward bias period, during which the photodetector in the pixel 100 is connected to a trace supplying the negative voltage to forward bias the photodetector. During the forward bias period 154 (FIG. 6) all charge traps within the photodetector are charged with electric charge. At the end of the forward bias period, a reset signal is applied via the reset line 310. During the reset period, the photodetector is connected to a trace supplying the positive voltage, which reverse biases the photodetector in the pixel 100. During the reset period, all the electric charge, except the electric charge trapped in the charge traps, is removed from the photodetector in the pixel 100. Homogenizing the amount of electric charge trapped in the photodetector in each pixel in the array prior to resetting the photodetector disables the mechanism that would creates image lag in the image sensor.

An embodiment of the image sensor 300 constructed using a two-dimensional array of the pixels 200 of FIG. 7 lacks a trace or set of traces that supplies a negative voltage to each of the pixels. Such embodiment additionally includes an additional line coupled to all the pixels in each row to control the transistor switches 206 and 208 to charge the capacitor 216 during the charge period 253 (FIG. 8).

It will be apparent to those skilled in the art that many modifications and variations may be made to the above-described embodiments of the present invention without departing substantially from the principles of the present invention. All such modifications and variations are intended to be included herein within the scope of the present invention, as defined in the claims that follow.

I claim:

1. A system for reducing illumination-dependent trapped charge effects in a complementary metal oxide semiconductor (CMOS) photodetector, the system comprising:

a negative-polarity voltage source connected to the photodetector via a first switch operable during a first time period to forward-bias the photodetector, the forward-biasing charging charge traps in the photodetector; and a positive-polarity voltage source connected to the photodetector via a second switch operable during a second time period to reverse bias the photodetector, the reverse-biasing removing charge from the photodetector except the charge trapped in the charge traps.

2. The system of claim 1, in which:

the negative-polarity voltage source comprises a voltage source having a polarity opposite to the positive-polarity voltage source; and the first switch comprises no more than a single pole and is connected between the negative-polarity voltage source and the photodetector.

3. The system of claim 1, in which:

the negative-polarity voltage source includes a capacitor; and the first switch comprises a double-pole changeover switch arranged to connect the capacitor to the positive-polarity voltage source during a third time period prior to the first time period and to connect the capacitor to the photodetector with a reversed polarity during the first time period.

4. A system for reducing illumination-dependent trapped charge effects in a complementary metal oxide semiconductor (CMOS) photodetector, the system comprising:

means for forward biasing the photodetector during a first time period to charge charge traps in the photodetector; and means for reverse biasing the photodetector during a second time period to remove charge from the photodetector except the charge trapped in the charge traps.

5. The system of claim 4, in which:
   the system further comprises means for accumulating charge during a third time period; and
   the means for forward biasing the photodetector comprises means for applying the accumulated charge with reversed polarity to the photodetector.

6. The system of claim 5, in which the means for forward biasing the photodetector and the means for reverse biasing the photodetector comprise switch means.

7. A method for reducing illumination-dependent trapped charge effects in a complementary metal oxide semiconductor (CMOS) photodetector, comprising:
   forward biasing the photodetector during a first time period to charge charge traps in the photodetector; and
   reverse biasing the photodetector during a second time period to remove charge from the photodetector except the charge trapped by the charge traps.

8. The method of claim 7, in which forward biasing the photodetector comprises:
   accumulating charge during a third time period; and
   applying the accumulated charge with a reversed polarity to the photodetector during the first time period.

9. The method of claim 7, in which forward biasing the photodetector comprises:
   charging an electrical storage element prior to forward biasing the photodetector; and
   using a charge stored in the electrical storage element to forward bias the photodetector.

10. A method for reducing image lag in an array of complementary metal oxide semiconductor (CMOS) photodetectors, the method comprising:
   forward biasing the photodetectors during a first time period to charge charge traps in the photodetectors; and
   reverse biasing the photodetectors during a second time period to remove charge from the photodetectors except the charge trapped in the charge traps.

11. The method of claim 10, in which forward biasing the photodetectors comprises:
   accumulating charge during a third time period; and
   applying the accumulated charge with a reversed polarity to the photodetectors during the first time period.

12. The method of claim 10, in which forward biasing the photodetector comprises:
   charging an electrical storage element; and
   using charge stored in the electrical storage element to forward bias the photodetector.

13. An image sensor having reduced image lag, the image sensor comprising:
   first traces connectable to receive a positive-polarity voltage; and
   a two-dimensional array of picture elements each connected to at least one of the first traces, each of the picture elements comprising a photodetector;
   a first switch array operable during a first time period to forward bias the photodetectors, the forward biasing charging charge traps in the photodetectors; and
   a second switch array operable during a second time period to connect the photodetectors to the first traces during the second time period to reverse bias the photodetectors, the reverse biasing removing charge from the photodetectors except the charge trapped in the charge traps.

14. The image sensor of claim 13, in which:
   the image sensor additionally comprises at least one second trace connectable to receive a negative-polarity voltage; and
   the first switch array comprises switches each having no more than a single pole, the switches connected between the at least one second trace and the photodetectors.

15. The image sensor of claim 13, in which:
   each of the picture elements additionally comprises a capacitor; and
   the first switch array comprises double-pole changeover switches arranged to connect each capacitor to the one of the first traces during a third time period prior to the first time period and to connect the capacitor with reversed polarity to a respective one of the photodetectors during the first time period.

16. The image sensor of claim 13, wherein the first switch array is operable to charge the charge traps in all the photodetectors substantially uniformly during the first time period.

* * * * *